US009853173B2

(12) United States Patent
Badano et al.

(10) Patent No.: US 9,853,173 B2
(45) Date of Patent: Dec. 26, 2017

(54) SEMICONDUCTOR STRUCTURE WITH TWO OPTICALLY COUPLED OPTICAL RESONANT CAVITIES AND METHOD OF MANUFACTURING SUCH A STRUCTURE

(71) Applicant: Commissariat a L'Energie Atomique et aux Energies Alternatives, Paris (FR)

(72) Inventors: Giacomo Badano, Lans En Vercors (FR); Christian Kriso, Saint-Martin-D'Heres (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 15/011,964

(22) Filed: Feb. 1, 2016

(65) Prior Publication Data

US 2016/0225923 A1 Aug. 4, 2016

(30) Foreign Application Priority Data

Feb. 2, 2015 (FR) ..................................... 15 00182

(51) Int. Cl.
*H01L 31/0203* (2014.01)
*H01L 31/0232* (2014.01)
(Continued)

(52) U.S. Cl.
CPC .. *H01L 31/02327* (2013.01); *H01L 31/02164* (2013.01); *H01L 31/105* (2013.01); *H01L 31/1032* (2013.01); *H01L 31/18* (2013.01)

(58) Field of Classification Search
USPC ....... 372/107; 257/E51.018, 13, 21, 98, 443, 257/E27.121, E31.093, E33.026, E33.073,
(Continued)

(56) References Cited

U.S. PATENT DOCUMENTS 4,731,640 A * 3/1988 Bluzer .............. H01L 27/14669
257/291
5,455,421 A 10/1995 Spears

FOREIGN PATENT DOCUMENTS

FR 2 985 373 A1 7/2013
FR 2 992 471 A1 12/2013

OTHER PUBLICATIONS

French Preliminary Search Report dated Dec. 9, 2015 in French Application 15 00182, filed Feb. 2, 2015 (with English Translation of Categories of Cited Documents).
(Continued)

*Primary Examiner* — Tram H Nguyen
(74) *Attorney, Agent, or Firm* — Oblon, McClelland, Maier & Neustadt, L.L.P.

(57) ABSTRACT

The invention relates to a semiconductor structure intended to receive an electromagnetic wave. The semiconductor structure comprises at least one first semiconductor resonant optical cavity conformed to absorb at least partially the electromagnetic wave and to provide an electrical signal proportional to the part of the electromagnetic wave absorbed. The semiconductor structure further includes a second dielectric resonant optical cavity of which a resonance wavelength is comprised in the predetermined range of wavelengths and is preferentially equal to the wavelength $\lambda_o$, the second resonant optical cavity being laid out to intercept at least part of the electromagnetic wave and being optically coupled to the first resonant optical cavity. The second resonant optical cavity is transparent to the predetermined range of wavelengths. The invention further relates to a semiconductor component comprising such a semiconductor structure and a method of manufacturing such a semiconductor structure.

11 Claims, 8 Drawing Sheets

(51) Int. Cl.
*H01L 31/0216* (2014.01)
*H01L 31/103* (2006.01)
*H01L 31/105* (2006.01)
*H01L 31/18* (2006.01)

(58) Field of Classification Search
USPC ... 257/432, 438, 461, 88, E29.069–E29.071, 257/E29.245, E45.001–E49.004; 438/16, 438/31, 35
See application file for complete search history.

(56) References Cited

OTHER PUBLICATIONS

Qin Wang et al. "Micro-Optical Elements Functioning in Non-Visible Spectral Range" Micro-Optics 2010, Proc. of SPIE, vol. 7716, 2010, 9 pages.
Rui Pedro Rocha et al. "Low f-Number Microlenses for Integration on Optical Microsystems", IEEE Sensors Journal, vol. 15, No. 7, Jul. 2015, 3 pages.
Menachem Nathan "Microlens Reflector for Out-of-Plane Optical Coupling of a Waveguide to a Buried Silicon Photodiode", Applied Physics Letters, vol. 85, No. 14, Oct. 4, 2004, 3 pages.
B. F. Levine "Quantum-well Infrared Photodetectors", Journal of Applied Physics, vol. 74, No. 8, Oct. 15, 1993, 82 pages.

* cited by examiner

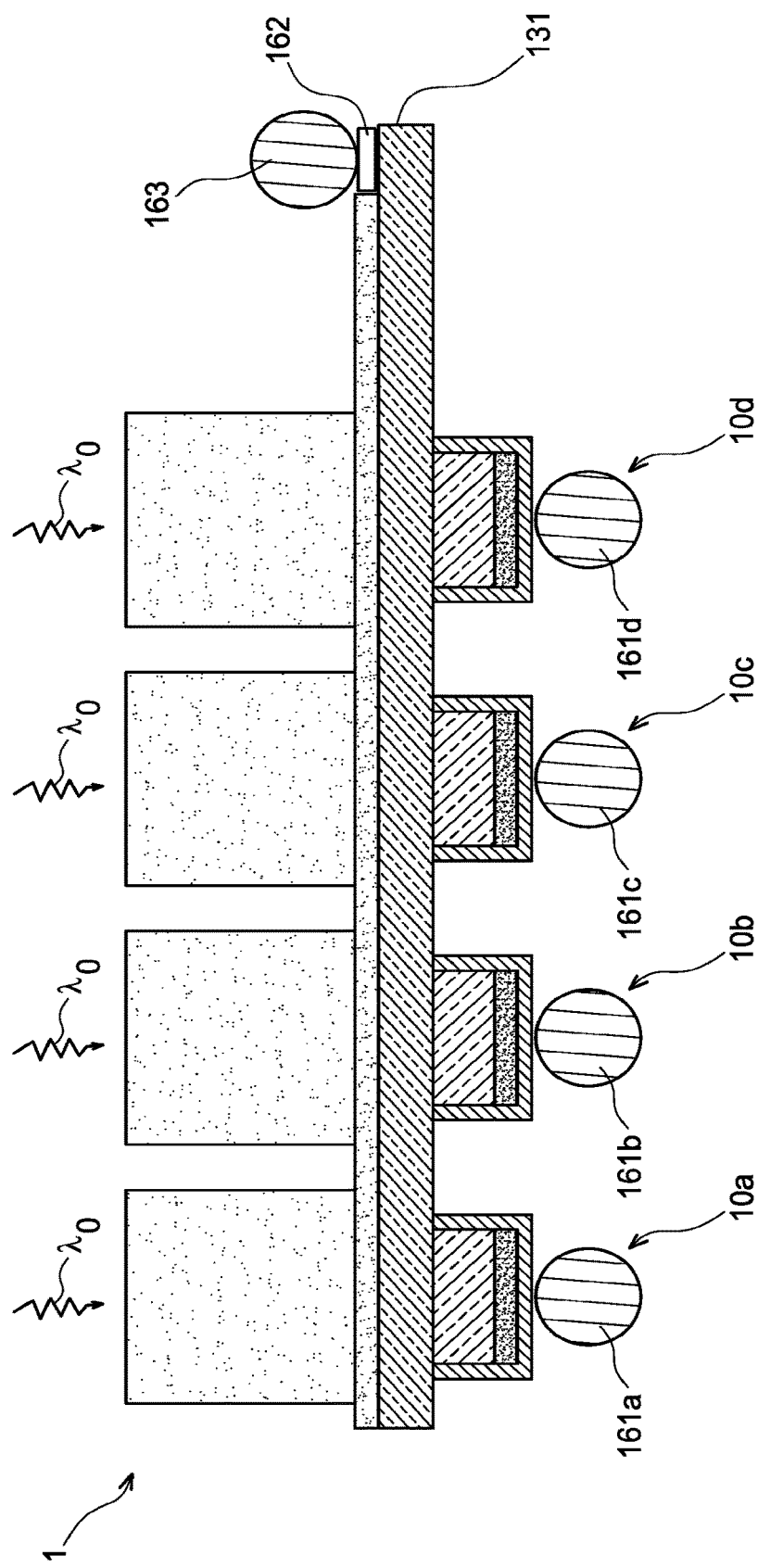

SEMICONDUCTOR STRUCTURE WITH TWO OPTICALLY COUPLED OPTICAL RESONANT CAVITIES AND METHOD OF MANUFACTURING SUCH A STRUCTURE

TECHNICAL FIELD

The invention relates to the field of the detection and/or the measurement of electromagnetic radiation and to semiconductor structures enabling such detection and/or measurement of electromagnetic radiation.

STATE OF THE PRIOR ART

Semiconductor structures enabling such detection and/or measurement of electromagnetic radiation are of multiple types and may thus just as easily be semiconductor structures of photodiode type, conventional or PIN, intended to be reverse polarized, as semiconductor structures of quantum well photodiode type or barrier photodetector type structures.

Whatever the type of such structure, they have, in use, a dark current which limits the sensitivity thereof. The origin of this dark current is the generation of non-photo generated electron-hole pairs in the structure. Yet this generation mainly occurs in the active zone of the structure in which photons are absorbed to generate the signal. Consequently, the dark currents are generally proportional to the volume of the active zone. This active zone, in order to maximize the signal, needs to occupy a large part of the volume of the structure, extending generally over practically the whole surface of the structure and over thicknesses of the order of several micrometers, and is thus the source of significant noise.

This is all the more true for structures suited to operate in infrared wavelengths, the latter being subjected to considerable noise due to the band-gap of the material in which they are formed. In fact, a band-gap width favors formation of a tunnel dark current in the active zone.

To overcome this drawback, it is known to concentrate the electromagnetic radiation in a reduced zone of the structure in which is arranged the active zone. Thus, the structure may receive the electromagnetic radiation on a large surface without however requiring an active zone occupying a large volume.

Among the different concentration possibilities, it is known particularly from the document FR 2992471 to obtain such a concentration of electromagnetic radiation from a resonant optical cavity.

Above and in the remainder of this document, resonant optical cavity is taken to mean a zone of an optical component, such as a semiconductor structure, configured so that an electromagnetic wave having a given wavelength or comprised in a given range of wavelengths enters into resonance when it penetrates into said zone. Such a resonant optical cavity is not necessarily hollow since it may be, as it is the case in semiconductor laser technologies, filled with an active medium. For a semiconductor structure, a resonant optical cavity is generally filled with one or more semiconductor materials.

In this structure, the active zone of the structure, that is to say that configured to absorb at least partially the electromagnetic wave to detect and to provide an electrical signal proportional to the part of the electromagnetic wave absorbed, is in part furnished in the resonant optical cavity. Thus, the active zone of the structure benefits from the focusing offered by the presence of the resonant optical cavity.

Nevertheless, the focusing power of such an optical cavity remains limited. In fact, the optical cavity makes it possible to focus the part of the electromagnetic wave received on a surface extending to substantially $(2\ \lambda 0/\pi)^2$ with $\lambda 0$ the wavelength of the electromagnetic wave to detect. In order to obtain a sufficient reception surface, it may thus be necessary to provide several resonant optical cavities for a given structure increasing by as much the dark current.

DESCRIPTION OF THE INVENTION

The present invention aims to overcome this drawback and thus has the aim of providing a semiconductor structure which, while having an active zone of small dimension through the benefit of using a resonant optical cavity, has a reception surface on which the electromagnetic wave received is detected which may be larger than that of a structure of the prior art which is limited to a surface extending to $(2\ \lambda 0/\pi)^2$.

The invention relates in this respect to a structure capable of absorbing an electromagnetic wave in a predetermined range of wavelengths which is centered around a wavelength $\lambda_0$, the semiconductor structure comprising:
at least one first semiconductor resonant optical cavity of which a first resonance wavelength is comprised in the predetermined range of wavelengths and is preferentially equal to the wavelength $\lambda_0$, said first resonant optical cavity being conformed to absorb at least partially the electromagnetic wave and to provide an electrical signal proportional to the part of the electromagnetic wave absorbed.

The semiconductor structure further includes:
a second dielectric resonant optical cavity of which a resonance wavelength is comprised in the predetermined range of wavelengths and is preferentially equal to the wavelength $\lambda_0$, the second resonant optical cavity being laid out to intercept at least part of the electromagnetic wave and being optically coupled to the first resonant optical cavity, the second resonant optical cavity being transparent to the predetermined range of wavelengths.

The use of such a second dielectric resonant optical cavity makes it possible to benefit from the cross section of the dielectric cavity to receive the part of the electromagnetic wave while conserving an active semiconductor zone of contained dimension, this being housed in the first resonant optical cavity. In fact, with such a semiconductor structure, it is the second resonant optical cavity which makes it possible to intercept the electromagnetic wave, optical coupling making it possible to transmit the wave thus intercepted in the first resonant optical cavity in which it will be absorbed. Yet, by virtue of its dielectric character, the second resonant optical cavity does not have the same dimensioning constraints as a semiconductor cavity. The result is that a structure comprising such a second resonant optical cavity makes it possible to obtain a more important cross section than that obtained by focusing by a semiconductor cavity used in the prior art, while conserving a contained size of the active zone.

Thus such a structure makes it possible to benefit from the use of the first resonant optical cavity and has a reception surface, that is to say a cross section, on which the electromagnetic wave received is detected which may be greater than that of a structure of the prior art which is limited to a surface extending to $(2\lambda_0/\pi)^2$.

"Second resonant optical cavity optically coupled to the first resonant optical cavity" is taken to mean that the first and second resonant optical cavities have suitable dimensionings and layout with respect to each other so that when an electromagnetic wave of which the wavelength is comprised in the predetermined range of wavelengths penetrates into one of the first and second resonant optical cavities, it is capable of being at least partially transmitted to the other of the first and second resonant optical cavities. Such optical coupling is more generally known under the denomination of evanescent optical coupling.

The second resonant optical cavity may comprise an optical index $N_2$ less than 2 and preferentially less than or equal to 1.4.

With such an optical index, the second resonant optical cavity has an index of low value vis-à-vis that of a semiconductor material such as the one of the first resonant optical cavity. The result is good transfer by optical coupling of the electromagnetic wave of the second resonant optical cavity in the first resonant optical cavity when the electromagnetic wave penetrates into the second resonant optical cavity.

Optical index of the first resonant optical cavity is taken to mean, here and in the remainder of document, the effective optical refractive index in the predetermined range of wavelengths. Thus when the material of the first resonant optical cavity is a substantially homogeneous semiconductor material, the optical index is the real part of the optical refractive index of this same semiconductor material. On the other hand when the first resonant optical cavity is formed of several semiconductor materials, such as for example several layers of semiconductor materials forming multi quantum wells, the optical index of the first resonant optical cavity is the real part of the effective optical index, that is to say the equivalent optical refractive index, of the metamaterial formed by these several materials. Since such a notion of effective optical index is moreover known to those skilled in the art, particularly from the document FR 2992471, it is not described in greater detail in this document.

The second resonant optical cavity may be made of a material selected from the group comprising glasses, thermoplastic polymers, elastomers, thermosetting polymers, photosensitive resins and mixtures of two or more of said materials.

Such dielectric material has the advantage, in addition to the possibility of obtaining an optical index less than or equal to 1.4, of being able to be shaped easily in order to define the second resonant optical cavity. The manufacture of a semiconductor structure comprising such a material for its second resonant optical cavity is thus all the more facilitated.

The semiconductor structure may be capable of receiving the electromagnetic wave along a mean emission direction,
the first resonant optical cavity being able to be dimensioned to have at least one first resonance direction, corresponding to the first resonance wavelength, which is substantially transversal to the emission direction.

A structure comprising such a first resonant optical cavity benefits particularly from the principle of the invention. In fact, since the optical coupling between the first optic is resonant along a direction transversal to the emission direction, the first resonant optical cavity may have a dimension along the emission direction sufficient to obtain good absorption of the electromagnetic wave. Since the cross section defined along the direction transversal to the direction is linked to the dimensions of the second resonant optical cavity, it is possible to obtain an important cross section with good absorption.

The first resonant optical cavity may have a first width $L_1$ along the first resonance direction,
the second resonant optical cavity having along at least this same first resonance direction a second width $L_2$ respecting the following equation:

$$L_2 = L_1 \times M \times \frac{N_2}{N_1},$$

with $L_2$ the second width, $L_1$ the first width, M an odd integer greater than or equal to 1, $N_1$ and $N_2$ the respective optical indices of the first and the second resonant optical cavities.

Such a dimension $L_2$ makes it possible to obtain good resonant optical coupling between the first and the second resonant optical cavities. The transfer of the electromagnetic wave from the second resonant optical cavity to the first resonant optical cavity when it penetrates into the second resonant optical cavity is thus particularly efficient.

The semiconductor structure may include a support having a first and a second face opposite to each other, the first resonant optical cavity being arranged in contact on the first face and the second resonant optical cavity being arranged in contact on the second face, the support being dimensioned in order to assure optical coupling between the first and the second resonant optical cavity.

Such a support is particularly advantageous to make it possible to contact the active zone of the structure located in the first resonant optical cavity. It may also be noted that such a support being able to be common to several structures, it facilitates their layout in order to form a component comprising several structures.

The semiconductor structure may be a structure of the type selected from the group comprising PIN type photodiodes, quantum well photodiodes, barrier type photodetectors,
the active zone of said semiconductor structure being able to be furnished in the first resonant optical cavity.

The semiconductor structure may include at least two first resonant optical cavities, said first resonant optical cavities each being optically coupled to the second resonant optical cavity.

Such a structure has a multitude of first resonant optical cavities and gains in absorption of the electromagnetic wave. Since the absorption rate is improved, the sensitivity of the structure is thus optimized.

The invention also relates to a semiconductor component comprising a plurality of semiconductor structures each intended to receive an electromagnetic wave, said component being characterized in that at least one, preferentially the totality, of the semiconductor structures is a semiconductor structure according to the invention.

Such a component comprising a structure according to the invention benefits from the advantages which are linked thereto.

The invention also relates to a method of manufacturing a semiconductor structure capable of absorbing an electromagnetic wave in a predetermined range of wavelengths which is centered around a wavelength $\lambda_0$,
the method comprising the following steps:
supplying at least one first semiconductor resonant optical cavity of which a first resonance wavelength is comprised in the predetermined range of wavelengths and is preferentially equal to the wavelength $\lambda_0$, said first resonant optical cavity being conformed to absorb at least partially the electromagnetic wave and to provide an electrical signal proportional to the absorbed part of the electromagnetic wave, supplying a second dielectric resonant optical cavity of which a second resonance wavelength is comprised in the range of wavelengths and is preferentially equal to the wavelength $\lambda_0$, the second resonant optical cavity being laid out to intercept part of the electromagnetic wave and being optically coupled to the first resonant optical cavity, the second resonant optical cavity being transparent to the predetermined range of wavelengths.

Such a method enables the manufacture of a structure according to the invention and thus benefiting from the advantages that are linked thereto.

The step of supplying the first resonant optical cavity may comprise the following sub-steps:

supplying a semiconductor support comprising a first and a second face, formation of the first resonant optical cavity in contact with the first face of the support, and in which the step of supplying a second resonant optical cavity consists in forming said second resonant optical cavity in contact with the second face of the support.

Such a support is particularly advantageous to make it possible to contact the active zone of the structure located in the first resonant optical cavity. It may also be noted that such a support being able to be common to several structures, it facilitates their arrangement in order to form a component comprising several structures.

The step of supplying the second resonant optical cavity may comprise the following sub-steps:

deposition of a layer of photosensitive resin on the surface of the support, for example by centrifugation, insolation of part of the layer of photosensitive resin, this part being the part intended to form the second resonant optical cavity, if the photosensitive resin is of the positive resin type, or the remainder of the layer of photosensitive resin, if said photosensitive resin is of the negative resin type, revelation of the second resonant optical cavity by the use of a solvent.

Such sub-steps make it possible to obtain the formation of the second resonant optical cavity with a reduced number of operations. In fact, since the photosensitive resin itself serves in the formation of the second resonant optical cavity, it is not necessary to carry out any etching operation, the cavity being formed during the revelation operation.

BRIEF DESCRIPTION OF THE DRAWINGS

The present invention will be better understood on reading the description of examples of embodiment, given for purely indicative purposes and in no way limiting, while referring to the appended drawings, in which:

FIG. 9 illustrates a semiconductor component comprising a plurality of semiconductor structures according to the invention.

Identical, similar or equivalent parts of the different figures bear the same numerical references in order to make it easier to go from one figure to the next.

The different parts represented in the figures are not necessarily shown according to a uniform scale in order to make the figures more legible.

The different possibilities (variants and embodiments) should be understood as not being mutually exclusive and may be combined together.

DETAILED DESCRIPTION OF PARTICULAR EMBODIMENTS

Figure 1:
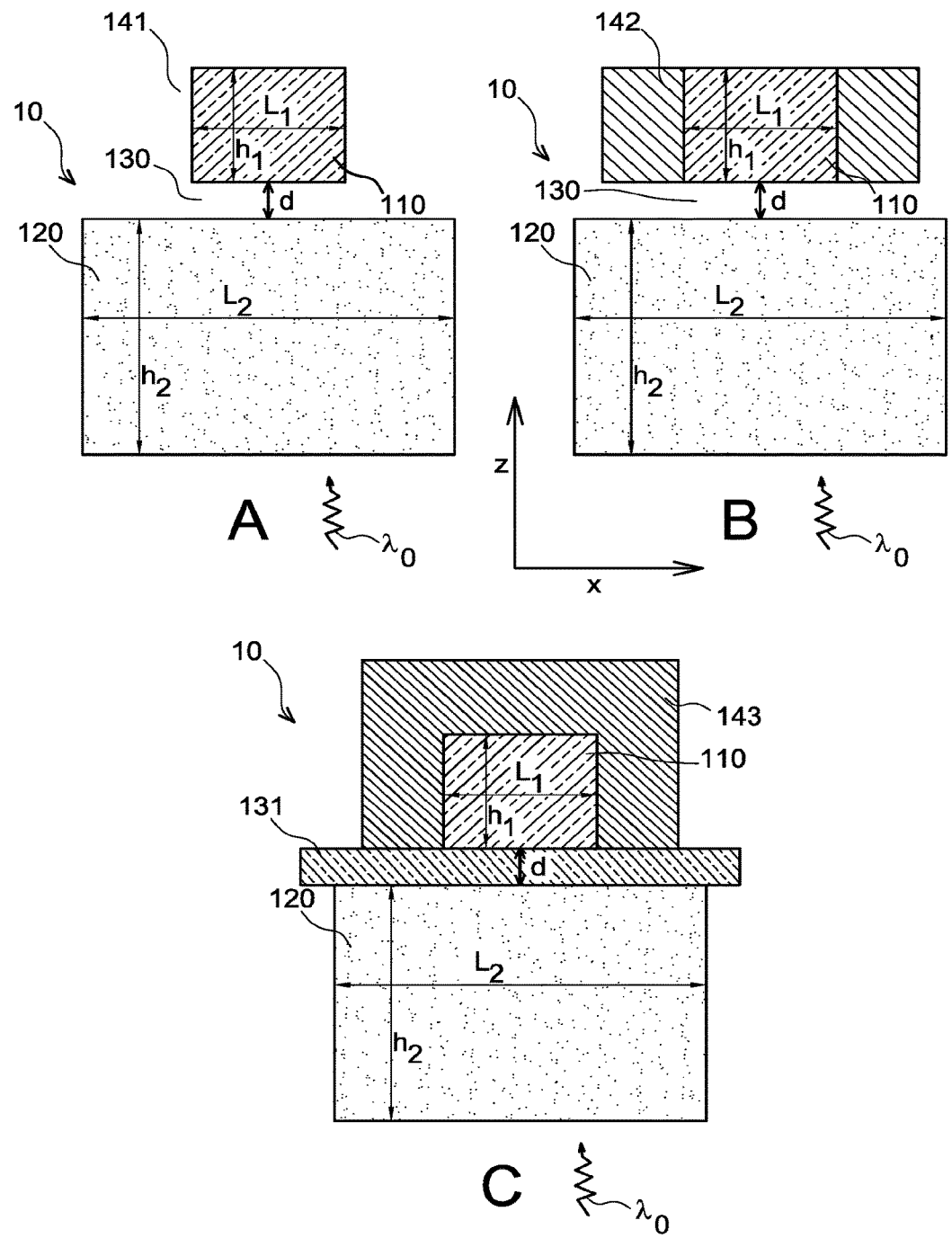
FIGS. 1A to 1C schematically illustrate three possibilities of layout of a semiconductor structure according to the principle of the invention.

FIGS. 1A to 1C schematically illustrate three examples of arrangement of a semiconductor structure 10 according to the principle of the invention, such a structure being intended to receive an electromagnetic wave in a predetermined range of wavelengths centered around a wavelength $\lambda_0$. In other words, the structure is capable of absorbing an electromagnetic wave in a predetermined range of wavelengths which is centered around a wavelength $\lambda_0$. Said semiconductor structure 10 is intended to receive the electromagnetic wave along a mean emission direction z which is represented in FIG. 1B by the axis z. Such a mean emission direction is substantially transversal with respect to a reception surface of the semiconductor structure 10.

Although in the remainder of this document the examples and the values given concern more particularly semiconductor structures intended to receive electromagnetic waves in a range of wavelengths comprised in the infrared, the invention is not limited only to the infrared. In fact, on the basis of the teachings given in this document and from their general knowledge, those skilled in the art are obviously able to transpose the principle of the invention to semiconductor structures capable of receiving electromagnetic waves in ranges of wavelengths other than the infrared, such as the ranges of wavelengths of the visible or the ultraviolet.

Such a semiconductor structure, as illustrated in FIG. 1A, comprises a first and second resonant optical cavity 110, 120 spaced apart by a coupling space 130 of thickness d.

The first resonant optical cavity 110 is a semiconductor resonant optical cavity of which a first resonance wavelength is comprised in the predetermined range of wavelengths. More precisely, the first resonance wavelength is preferentially equal to the central wavelength $\lambda_0$ of the predetermined range of wavelengths. The first resonance wavelength of the first resonant optical cavity 110 is defined by a suitable dimensioning of the first resonant optical cavity 110 and by optical confinement means arranged on either side of the first resonant optical cavity 110.

Such a dimensioning of the first resonant optical cavity 110 is known from the prior art and particularly from the document FR 2992471.

Thus the first resonant optical cavity 110 has at least one dimension $L_1$ along a direction x substantially transversal to the mean emission direction z which is suited to have a resonance wavelength. For a semiconductor structure 10 suited to receive an electromagnetic wave in the range of mid-wave infrared (MWIR) wavelengths, that is to say comprised between 3 and 5 µm, the first resonant optical cavity may have at least one dimension $L_1$ transversal to the emission direction which is 1 µm. For an electromagnetic wave comprised in the range of long wave infrared (LWIR) wavelengths (that is to say comprised between 8 µm and 12 mm), the first resonant optical cavity 110 may have at least one dimension $L_1$ transversal to the emission direction z which is 2 µm. Obviously, in order to optimize the optical confinement of the incident electromagnetic wave, the first resonant optical cavity 110 may have a shape assuring a resonance on at least two directions transversal to the emission direction z. Thus the first resonant optical cavity 110 may have a square transversal section of side $L_1$ with respect to the emission direction z or a circular transversal section of diameter $L_1$ with respect to the emission direction z.

The dimension $h_1$ of the first resonant optical cavity 110 along the emission direction z may be chosen in order to optimize the absorption of the electromagnetic wave. Thus if the semiconductor structure 10 is suited to receiving an electromagnetic wave in the mid-wave infrared range of wavelengths, the dimension $h_1$ of the first resonant optical cavity 110 along the emission direction z is preferentially greater than or equal to 400 nm. For a first electromagnetic wave comprised in the long wave infrared range of wavelengths, the dimension $h_1$ of the first resonant optical cavity 110 along the emission direction z is preferentially greater than or equal to 800 nm.

In the example of layout illustrated in FIG. 1A, the optical confinement means are provided by a break of optical index between the material of the first resonant optical cavity 110 and the material 141 surrounding the first resonant optical cavity which, although it is here air, may be another material having a low optical index, such as a dielectric material having an optical index less than 1.5. Thus for a semiconductor material of the first resonant optical cavity 110 of index $N_1$ of 3.5+0.2 i, the imaginary part corresponding to the absorbance, and air as material surrounding the cavity of optical index $N_0$ of 1, it results in a high optical index ratio of 3.5 which makes it possible to provide good confinement of the part of the electromagnetic wave penetrating the first resonant optical cavity 110.

The first resonant optical cavity 110 is conformed to absorb at least partially the electromagnetic wave and to provide an electrical signal proportional to the absorbed part of the electromagnetic wave. As indicated in the preceding paragraph, such an absorbance is provided by a semiconductor material having in the predetermined range of wavelengths an optical index of which the imaginary part is not zero, equal for example to 0.2 i. The first resonant optical cavity 110 comprises an active zone of the semiconductor structure 10 in order that the first resonant optical cavity 110 has the conformation suited to provide an electrical signal proportional to the part of the first electromagnetic wave absorbed.

Thus, for a semiconductor structure 10 selected from the group comprising conventional photodiodes, PIN type photodiodes, quantum well photodiodes, barrier type photodetectors, the first resonant optical cavity 110 comprises respectively one of the doped zones of the conventional photodiode, the intrinsic zone of the PIN type photodiode, the quantum wells of the quantum well photodiode and one of the two doped zones of the barrier type photodetector.

Such active parts are known from the prior art, and in particular may be cited the document FR 2992471, the scientific article of B. F Levine published in the scientific journal "Journal of Applied Physics" in 1993 volume 74 pages R1 to R81, and the document FR 2985373. For these reasons, apart from the examples of embodiment which are described below in relation with FIGS. 5A to 5F, 6 and 7, they are not described in further detail in this document.

It may nevertheless be noted that within the scope of an application of the principle of the invention for detection in infrared wavelength ranges, the first resonant optical cavity 110 may be made of at least one of the materials selected from the group comprising gallium arsenide GaAs, indium antimonide InSb, gallium antimonide GaSb and ternary semiconductors such as gallium-aluminum arsenides $Al_xGa_{1-x}As$, mercury-cadmium tellurides $Hg_{1-x}Cd_xTe$ and gallium-indium arsenides $In_xGa_{1-x}As$ with x comprised between 0 and 1.

At least one semiconductor material constituting the first resonant optical cavity is chosen to be absorbent in the range of wavelengths. Such a choice may in particular be made by choosing a material having a band-gap energy less than the energy corresponding to the upper limit of the range of wavelengths. Thus if the example is taken of ranges comprised in the infrared and mercury-cadmium tellurides $Hg_{1-x}Cd_xTe$ of which the band-gap energy varies with the composition x of cadmium, it is possible to define the following choices:

for the range of mid wave infrared wavelengths below 3 µm (thus upper limit at 3 µm), the minimum proportion of cadmium x may be greater than 0.5, for the range of mid wave infrared wavelengths below 5 µm (thus upper limit at 5 µm), the proportion of cadmium x may be greater than 0.4, for a range of long wave infrared wavelengths below 10 µm (thus upper limit at 10 µm), the minimum proportion of cadmium x may be greater than 0.3.

More generally, it should be noted that for a range of infrared wavelengths, at least one material of the first resonant optical cavity has an band-gap energy comprised between 0 eV (0 eV excluded) to 1.4 eV.

The second resonant optical cavity 120 is a dielectric resonant optical cavity. The material constituting the second resonant optical cavity may be selected from the group comprising glasses, thermoplastic polymers, elastomers, thermosetting polymers, photosensitive resins and mixtures of two or more of said materials. Said material may further comprise a doping element in order to obtain a suitable refractive index. The material constituting the second resonant optical cavity 120 has a refractive index less than or equal to 2 and preferentially less than 1.5. The material of the second resonant optical cavity 120 may thus be for example a photosensitive resin such as the resin AZ®4562 commercialized by Clariants® which has a refractive index of 1.4.

In order to assure optical coupling between the first and the second resonant optical cavities 110, 120, the second resonant optical cavity is tuned in resonance wavelengths with the first resonant optical cavity 110. Such resonance tuning may be obtained by a second width $L_2$ of the cavity of the second resonant optical cavity respecting the following equation:

$$L_2 = L_1 \times M \times \frac{N_2}{N_1} \quad (1)$$

with $L_2$ the second width, $L_1$ the first width, M an odd integer greater than or equal to 1, $N_1$ and $N_2$ the respective optical indices of the first and the second resonant optical cavities 120. In the same way as for the first resonant optical cavity 110, the second resonant optical cavity 120 may be dimensioned to optimize wavelength resonance tuning with the first resonant optical cavity 110. Thus, the second resonant optical cavity may have a shape assuring resonance tuning on at least two directions transversal to the mean emission direction z. Thus, the second resonant optical cavity 120 may have a square transversal section of side $L_2$ with respect to the emission direction or a circular transversal section of diameter $L_2$ with respect to the emission direction.

The dimension $h_2$ of the second resonant optical cavity 120 along the emission direction z is suited to have a resonance wavelength or a harmonic of this resonance wavelength comprised in the predetermined range of wavelengths. In this way, the second resonant optical cavity 120 is suited to receive the first electromagnetic wave and to transmit it to the first resonant optical cavity 110 through the optical coupling existing between the first and the second resonant optical cavity 110, 120. The confinement of the electromagnetic radiation in the first resonant optical cavity is particularly favored by an important difference of optical index $N_1$-$N_2$ between the first and the second resonant optical cavity.

It may be noted that the dimensions $L_2$ and $h_2$ are preferentially chosen large compared to the wavelength $\lambda_0$ so that the semiconductor structure 10 has an important cross section. It will thus be noted that the dimensions $L_2$ and $h_2$ of the second resonant optical cavity 120, providing the aforementioned dimensional conditions are observed, are of the order of the size of a pixel of a component comprising such semiconductor structures 10, that is to say comprised between 3 and 40 µm.

The coupling between the first and the second resonant optical cavity 110, 120 is also optimized through the use of a suitable distance d between them. In fact, the distance d between the first and the second resonant optical cavity 110, 120 is sufficiently small to allow optical coupling between the first and the second resonant optical cavity 110, 120. What is more, this distance d may be chosen to maximize coupling between the first and the second resonant optical cavity as a function of the dimensions of the first and second resonant optical cavity, the constituent materials thereof and the optical index of the material(s) constituting the space between the first and the second resonant optical cavity 110, 120. As will be shown hereafter in this document, such an optimization of the distance d between the first and the second resonant optical cavity may be obtained using simple routine calculations that can be performed by those skilled in the art having taken cognizance of the present disclosure.

The coupling of the first and second resonant optical cavity 110, 120 may also be optimized by adapting the positioning of the second resonant optical cavity 120 with respect to the first resonant optical cavity 120 in directions transversal to the emission direction z. Thus the first and the second resonant optical cavity 110, 120 are preferentially centered with respect to each other. In the case where the first resonant optical cavity and the second resonant optical cavity 110, 120 both have a square or circular section, the centers of the sections of the first and the second resonant optical cavity 110, 120 are aligned along the direction z.

The second resonant optical cavity 120 is laid out with respect to the first resonant optical cavity 110 to intercept at least part of the first electromagnetic wave. Such a layout of the second resonant optical cavity 120 is obtained by an arrangement of the second resonant optical cavity upstream of the first resonant optical cavity along the emission direction z.

FIG. 1B schematically illustrates a semiconductor structure 10 according to a second layout possibility according to the invention in which the confinement of the first resonant optical cavity 110 is provided by the use of a reflective material 142, such as a metal material. A semiconductor structure 10 according to this second layout possibility differs from a structure according to the first layout possibility in that the first resonant optical cavity 110 is bounded by the reflective material 142 on at least two of its sides and along at least one direction x substantially transversal to the emission direction z.

The reflective material 142 may be a metal material preferentially selected from gold, aluminum and copper. According to this same second layout possibility, the reflective material may also be an assembly of semiconductor layers forming a Bragg mirror of which the range of reflected wavelengths is centered around the wavelength $\lambda_0$.

In the same way as for the first layout possibility described above and in order to optimize the optical confinement of the first electromagnetic wave, the first resonant optical cavity 110 according to this second layout possibility may have a shape assuring resonance on at least two directions transversal to the emission direction z. Thus the first resonant optical cavity 110 may have a square transversal section of side $L_1$ with respect to the emission direction z with the reflective material on each of its four sides. The first resonant optical cavity 110 may also have a circular transversal section of diameter $L_1$ with respect to the emission direction z of the reflective material being arranged on the circumference of the circle.

The dimension $L_1$ of the first resonant optical cavity 110 along at least one direction transversal to the emission direction z is suited to taking into account the presence of the reflective material 142. Thus for a semiconductor structure 10 suited to receive a first electromagnetic wave in the range of mid-wave infrared wavelengths filled with an absorbent material of index for example 3.5, the first resonant optical cavity may have at least one dimension $L_1$ transversal to the emission direction which is 1.2 µm. For a first electromagnetic wave comprised in the range of long wave infrared wavelengths, the first resonant optical cavity 110 may have at least one dimension $L_1$ transversal to the emission direction z which is 2.4 µm. More generally, according to this second layout possibility, the dimension $L_1$ of the first resonant optical cavity 110 along at least one direction transversal to the emission direction z may follow the formula described in the document FR 2992471, that is to say $L_1=\lambda_0/2n_{eff}$ with $n_{eff}$ the optical index, that is to say here the effective refractive index of the fundamental mode of vibration of the first resonant optical cavity 110.

FIG. 1C schematically illustrates a semiconductor structure 10 according to a third layout possibility according to the invention which differs from a semiconductor structure 10 according to the second layout possibility in that the first and the second resonant optical cavity 110, 120 are separated from each other by a support 131 and in that the first resonant optical cavity 110 also comprises on its part opposite to the second resonant optical cavity 120 the reflective material 143.

This third layout possibility is more representative of a semiconductor structure 10 according to the invention as it may be implemented. In fact, such a support 131 facilitates the layout of several semiconductor structures 10 in order to form a semiconductor component and moreover makes it possible to arrange therein a non-active (as opposed to the aforementioned active zone) and absorbent part of the semiconductor structure 10 such as one of the p or n zones of a PIN photodiode or of a quantum well photodiode, or one of the doped zones and the potential barrier of a barrier type photodetector. The first and the second layout possibility have in fact to call upon an encapsulation material or a maintaining system in order to assure positioning between the first and the second resonant optical cavity 110, 120.

What is more, according to this third layout possibility of the invention, the reflective material, when it is a conductor material, such as a metal material, can serve as metal contact in order to polarize the structure. According to this possibility, the first resonant optical cavity may comprise at its sides and/or its part opposite to the second resonant optical cavity 120 a passivation layer offering an electric insulation, not illustrated in FIG. 1C, in order to provide a localized electrical contact uniquely on a well-defined location of the first resonant optical cavity 110.

The presence of the reflective material at the part of the first resonant optical cavity 110 which is opposite to the second resonant optical cavity 120 makes it possible to obtain better confinement of the first wavelength when it penetrates into the first resonant optical cavity.

The dimensioning of the first resonant optical cavity 110 according to this third layout possibility is similar to that described for the semiconductor structure 10 according to the second layout possibility.

Obviously, these three layout possibilities are only given by way of illustration of the principle of the invention and are in no way limiting, the characteristics of each of them not being in any way exclusive. Thus, the first layout possibility, just like the second layout possibility, are obviously compatible with the presence of a support 131, the distance d then being suited to take account of the refractive index of the support 131.

FIGS. 2A to 3B illustrate examples of calculations of the variation in the quantum efficiency of a semiconductor structure according to the invention making it possible to define the dimensions of the second resonant optical cavity 120 and the distance d between the first and the second resonant optical cavity 110, 120. These calculations are obtained by finite element simulations which are perfectly realizable by those skilled in the art having knowledge of the present disclosure and which can be carried out within the scope of routine tests in order to optimize the dimensioning of a semiconductor structure 10 according to the invention. Such calculations shows particularly that the optimization of the coupling distance d between the first and the second resonant optical cavity 110, 120 is mainly dependent on the dimension $L_1$ of the first resonant optical cavity 110 along at least one direction transversal to the emission direction z, the dimensions of the second resonant optical cavity only having a small influence.

Figure 2A:
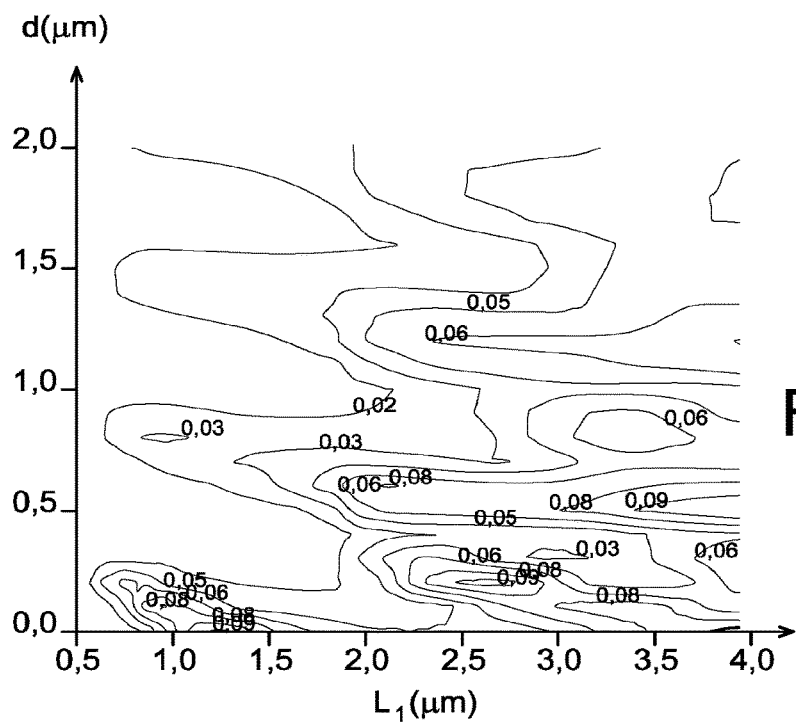
FIGS. 2A and 2B are respectively a first and a second graph illustrating the variation in the quantum efficiency of a semiconductor structure illustrated in FIG. 1B as a function of the spacing between a first and a second resonant optical cavity of said semiconductor structure for respectively a range of wavelengths between 4 and 5 µm and a range of wavelengths between 8 and 10 µm.
Figure 2B:
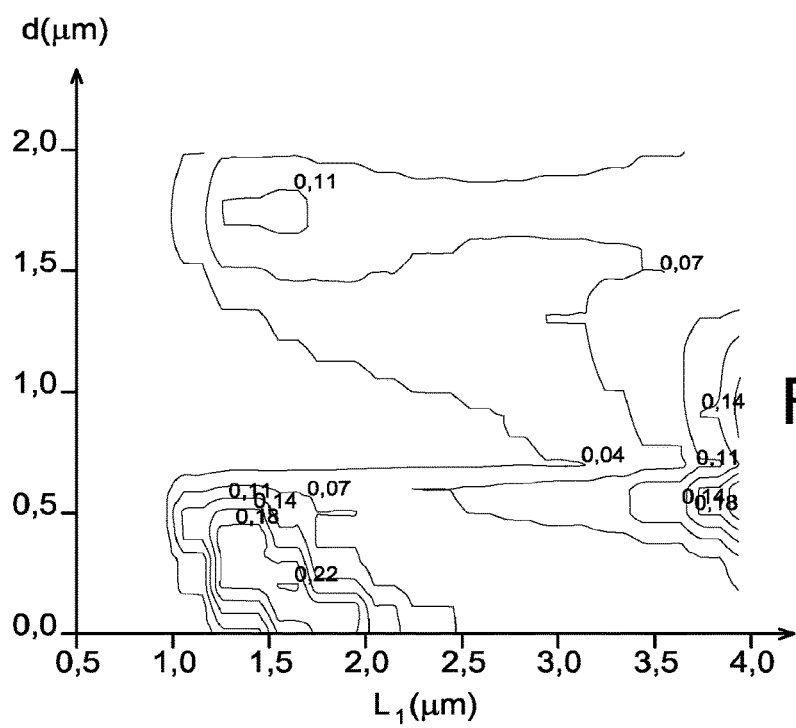

Thus FIGS. 2A and 2B illustrate respectively the variation in quantum efficiency for a semiconductor structure 10 as illustrated in FIG. 1B comprising a first resonant optical cavity 110 of square section of which the dimension $h_1$ along the emission direction z is equal to 400 nm for FIG. 2A and 800 nm for FIG. 2B. The optical index of the material of the first resonant optical cavity 100 for these calculations has been set at 3.4+0.2 i. FIG. 2A corresponds to the quantum efficiency in the range of wavelengths extending from 4 to 5 µm whereas FIG. 2B corresponds to the range of wavelengths extending from 8 to 10 µm.

It may be seen in these two figures that for a given dimension $L_1$ of the first resonant optical cavity 110, the distance between the first and the second resonant optical cavity 110, 120 has several optimums for which the quantum efficiency is maximal. This is true not just for the range of wavelengths extending from 4 to 5 µm but also for the range of wavelengths extending from 8 to 10 µm.

On the basis of the results of the calculations illustrated in FIGS. 2A and 2B, it is thus possible to provide the dimensions d of the space 130 which, in association with a given dimension $L_1$ of the first resonant optical cavity 110, makes it possible to end up with optimum quantum efficiency. In fact, the dimension $L_1$ of the first resonant optical cavity is determined as a function of the central wavelength $\lambda_0$ of the predetermined range of wavelengths of the electromagnetic wave. Thus, by considering an optical index of 3.4 for the first resonant optical cavity 110 and an index of the space 130 between the first and the second resonant optical cavity 110, 120 of 3.4, it is possible to end up with table 1 below which illustrates this possibility by providing 4 to 5 optimum dimensions d for 3 ranges of wavelengths in the infrared.

TABLE 1

Optimum dimensions d of the space between the first and the second resonant optical cavity for respectively the range of wavelengths of 3 to 5 µm, 8 to 10 µm and for 100 µm, for a space having an optical index of 3.4.

| Range | d1 | d2 | d3 | d4 | d5 |
|---|---|---|---|---|---|
| 3 to 5 µm | 200 ± 100 nm | 800 ± 100 nm | 1300 ± 100 nm | 1900 ± 100 nm | |
| 8 to 10 µm | 300 ± 200 nm | 1700 ± 200 nm | 2900 ± 200 nm | 4000 ± 200 nm | 5300 ± 200 nm |
| 100 µm | 5.5 ± 1 µm | 20 ± 1 µm | 35 ± 1 µm | 50 ± 1 µm | 64 ± 1 µm µm |

For a space 130 between the first and the second resonant optical cavity having an optical index of 1.4, the values are given in table 2 below.

TABLE 2

Optimum dimensions d of the space between the first and the second resonant optical cavity for respectively the range of wavelengths of 3 to 5 µm, 8 to 10 µm and for 100 µm, for a space having an optical index of 1.4.

| Range | d1 | d2 | d3 | d4 | d5 |
|---|---|---|---|---|---|
| 3 to 5 µm | 0-300 nm | 1900 ± 150 nm | 1300 ± 150 nm | 1900 ± 100 nm | |
| 8 to 10 µm | 0-600 nm | 1700 ± 300 nm | 2900 ± 300 nm | 4000 ± 300 nm | 5300 ± 300 nm |
| 100 µm | 0-4 µm | 20 ± 2 µm | 35 ± 2 µm | 50 ± 2 µm | 64 ± 2 µm |

Figure 3A:
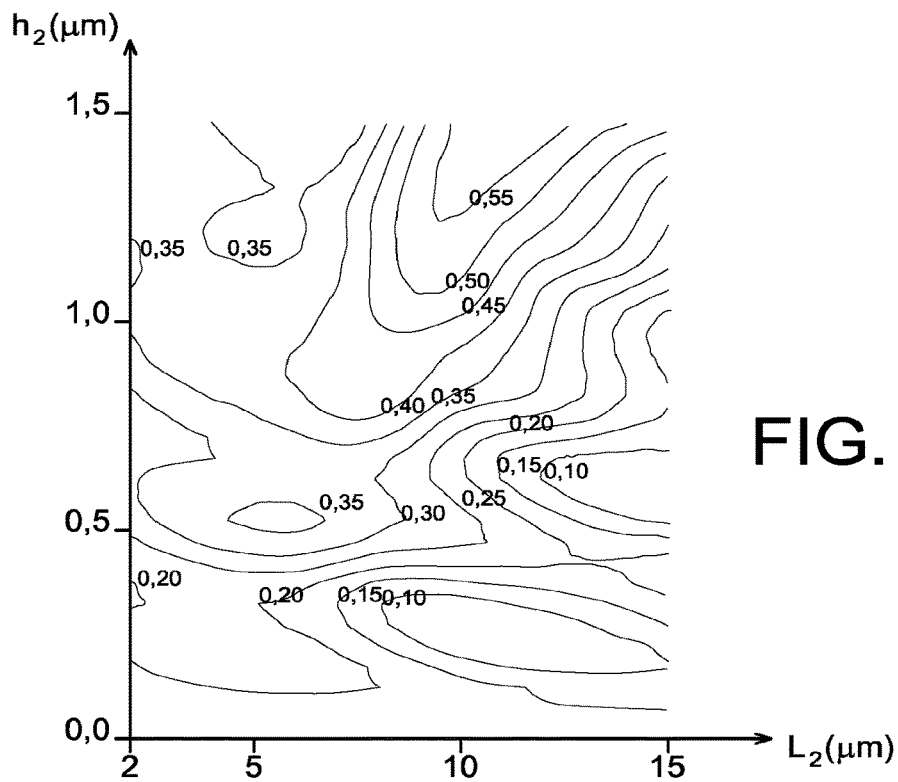
FIGS. 3A and 3B are graphs illustrating the variation in the quantum efficiency of a semiconductor structure illustrated in FIG. 1B as a function of the height and the width of the second resonant optical cavity of said semiconductor structure for respectively a range of wavelengths between 4 and 5 µm and a range of wavelengths between 8 and 10 µm.
Figure 3B:
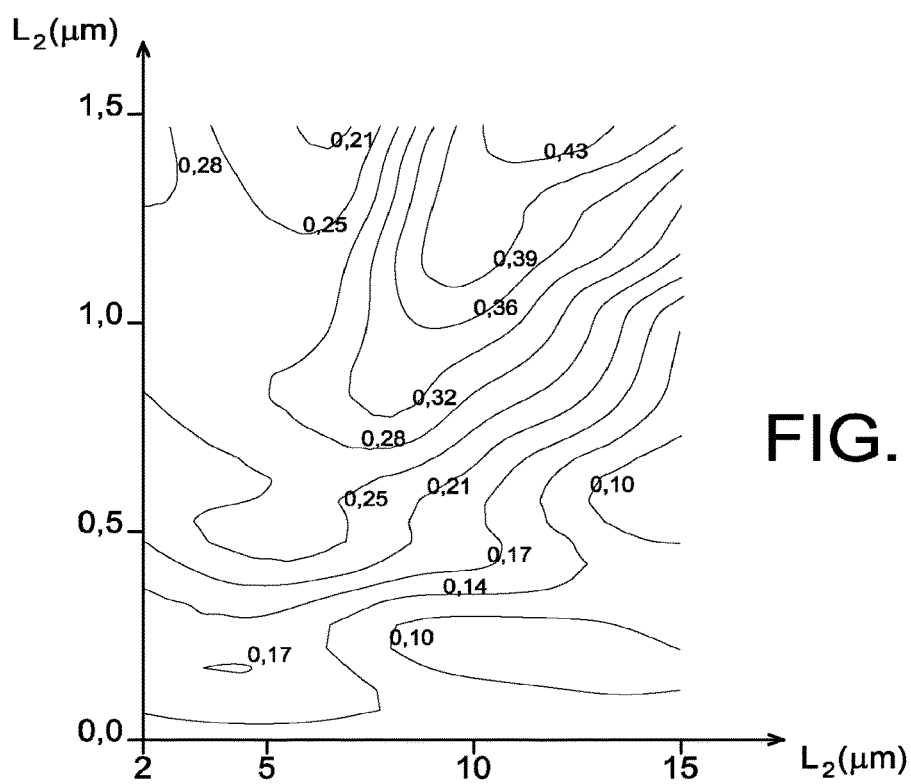

Obviously, these values determined for a semiconductor structure 10 according to the second layout possibility are directly transposable to a semiconductor structure 10 according to the third layout possibility FIGS. 3A and 3B illustrate the influence of the dimensioning of the second resonant optical cavity on quantum efficiency for a range of wavelengths of 8 to 10 µm, a pixel pitch of 15 µm and spacings between the resonant optical cavities respectively of 300 nm and 1900 nm, corresponding to the maxima d1 and d4 of Table 1. For these two graphs, the semiconductor structure 10 is according to the second layout possibility and comprises a first resonant optical cavity of square section of which the dimensions $L_1$ and $h_1$ are respectively set at 2 µm and at 800 nm for FIGS. 3A and 3B. The optical indices of the first resonant optical cavity, the space 130 between the first and the second resonant optical cavity 110, 120 and the second resonant optical cavity have been respectively set at 3.4+0.2i, 3.4 and 1.4.

FIG. 3A thus illustrates the variation in quantum efficiency with respect to the dimensions $L_2$ and $h_2$ of the second resonant optical cavity 120 in the range of wavelengths of 8 to 12 µm, a pixel pitch of 15 µm and a spacing between the resonant optical cavities of 300 nm. It may thus be seen that if maximum quantum efficiency may be obtained for dimensions $L_2$ and $h_2$ respectively around 10 µm and 1.5 µm, several dimensionings of the second resonant optical cavity 120 may be envisaged to obtain a quantum efficiency greater than 0.35.

This same observation may be made for FIG. 3B and the range of wavelengths extending from 8 to 10 µm for which a maximum quantum efficiency may be observed for dimensions $L_2$ and $h_2$ respectively around 12.5 µm and 1.5 µm. In the same way, several dimensionings of the second resonant optical cavity 120 may be envisaged to obtain a quantum efficiency greater than 0.28.

Those skilled in the art are thus able, from these routine calculations, to determine the dimensioning of the space 130 between the first and the second resonant optical cavity 110, 120, or of the support 130, and of the second resonant optical cavity 120 whatever the predetermined range of wavelengths.

Figure 4A:
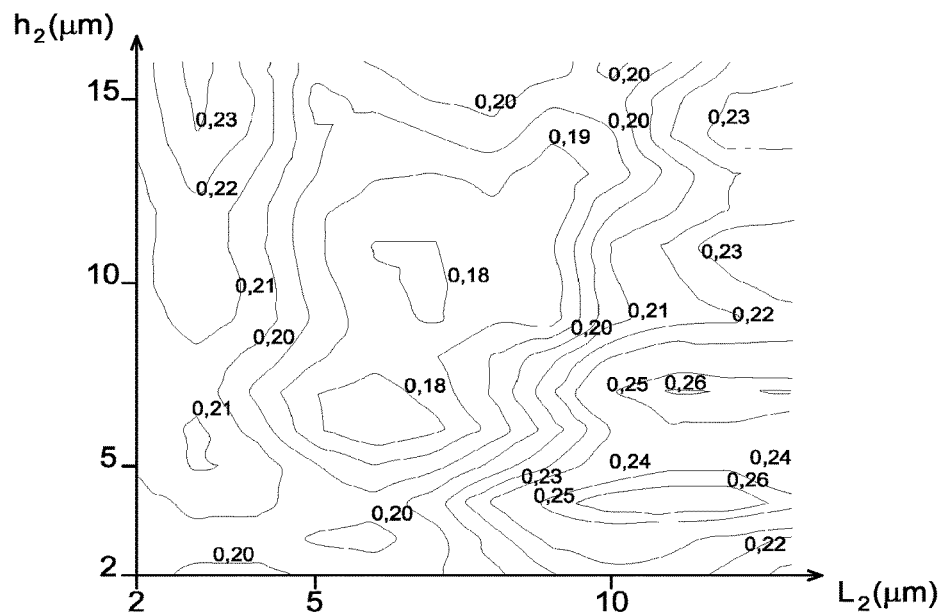
FIGS. 4A and 4B are graphs illustrating the variation in the quantum efficiency of a semiconductor structure illustrated in FIG. 1B as a function of the height and the width of the second resonant optical cavity of said semiconductor structure for respectively a semiconductor structure comprising four first resonant optical cavities and a semiconductor structure comprising six first resonant optical cavities.
Figure 4B:
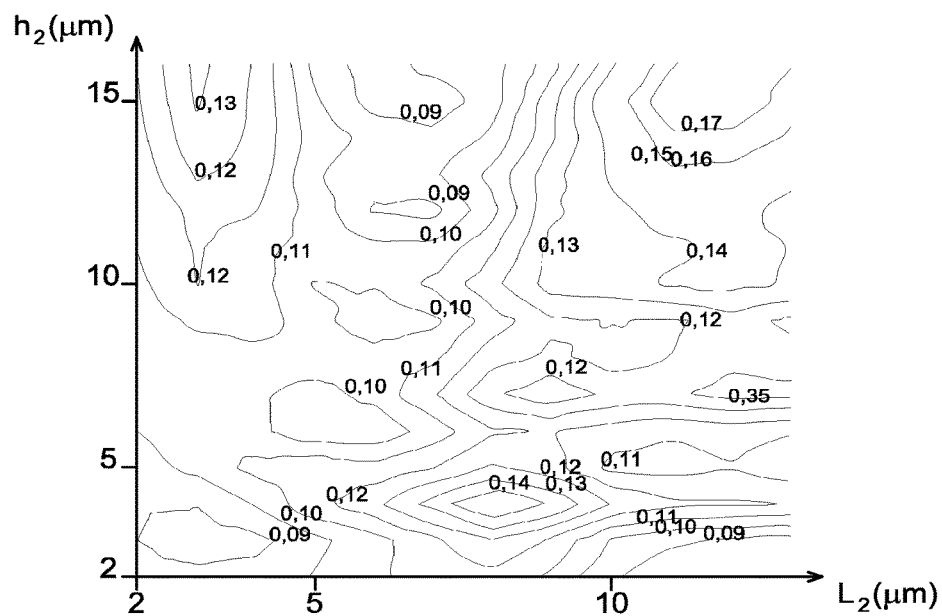

Such a type of calculation may also be adapted to dimension a semiconductor structure 10 according to the principle of the invention which comprises more than one first resonant optical cavity. Thus FIGS. 4A and 4B illustrate the variation in the quantum efficiency of a semiconductor structure 10 comprising respectively 4 and 6 first resonant optical cavities as a function of the dimensions $L_2$ and $h_2$ of the second resonant optical cavity 120 and for dimensional conditions of the semiconductor structure 10 identical to those used for the respective calculations illustrated in FIGS. 3A and 3B, a pixel pitch of 15 µm and a spectral range between 8 and 10 µm.

Figure 5A:
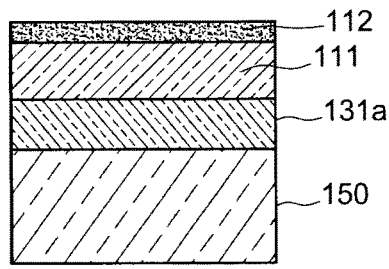
FIGS. 5A to 5F illustrate the main steps of manufacturing a semiconductor structure according to the invention.
Figure 5B:
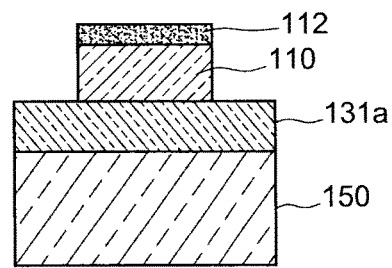
Figure 5C:
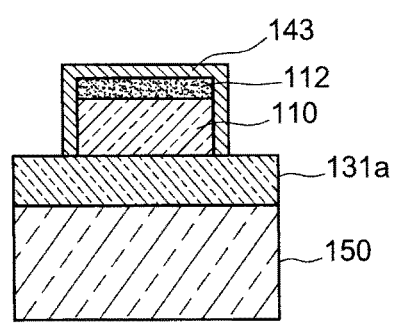
Figure 5D:
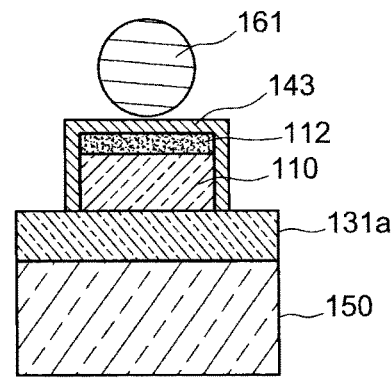
Figure 5E:
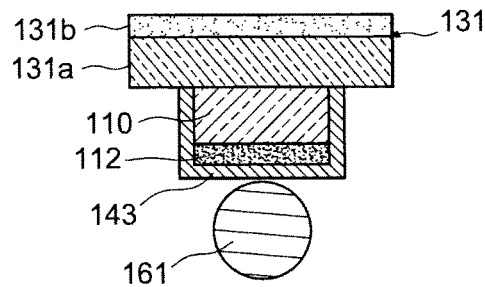
Figure 5F:
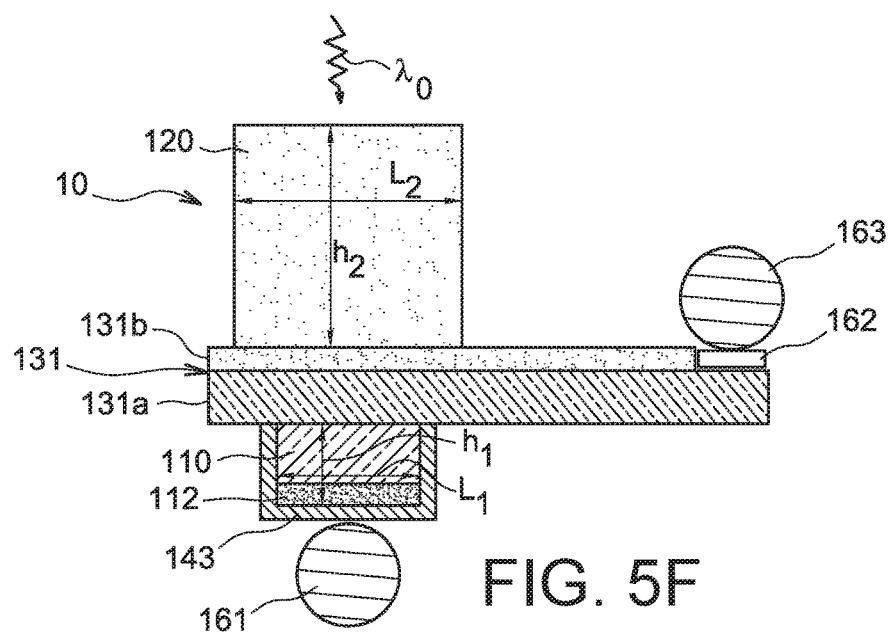

FIGS. 5A to 5F illustrate a method of manufacturing a semiconductor structure 10 according to the third layout possibility according to the invention in which the first resonant optical cavity 110 comprises the active zone of a conventional photodiode. Such a method comprises the following steps:

supplying a substrate 150, said substrate 150 comprising a first semiconductor layer 131a of a first type of conductivity intended to form one of the doped zones of the photodiode and to form partially the support 131, deposition in contact with the first semiconductor layer 131a of a second semiconductor layer 111 of a second type of conductivity opposite to the first type of conductivity so that the first and the second semiconductor layer 131a, 111 together form a structure of the conventional photodiode type, the concentration of doping elements of the second semiconductor layer 111 being suited so that the space charge zone extends into the second semiconductor layer 111, passivation of the surface of the second semiconductor layer 111 which is opposite to the first semiconductor layer 131a by the deposition of a first passivation layer 112, as is illustrated in FIG. 5A, the second semiconductor layer 111 and the first passivation layer 112 together having a thickness along the direction z equal to $h_1$, selective etching of the second semiconductor layer 111 and the first passivation layer 112 so as to form at least partially the first resonant optical cavity 110 with at least one of these dimensions transversal to the emission direction z equal to $L_1$, as is illustrated in FIG. 5B, selective deposition of a reflective metal material 143 in contact with the first resonant optical cavity 111 on its sides and its part opposite to the first semiconductor layer 110, as illustrated in FIG. 5C, the reflective material 143 being in electrical contact on the sides of the first resonant optical cavity 110 in order to provide a first metal contact of the semiconductor structure 1, deposition of a metal bead 161, such as a bead of indium, on the surface of the reflective material 143 to enable a connection by hybridization to a reading circuit, as is illustrated in FIG. 5D, etching of the substrate 150 so as to free the surface of the first semiconductor layer 131a which is opposite to the first resonant optical cavity 110, passivation of the surface of the first semiconductor layer 131a which is opposite to the first resonant optical cavity 110 by the deposition of a second passivation layer 131b, as is illustrated in FIG. 5E, the first semiconductor layer 131a and the second passivation layer 131b together having a thickness along the direction z equal to d, formation of the second resonant optical cavity 120 in contact with the second passivation layer 131b, the second resonant optical cavity 120 being laid out to intercept at least part of the electromagnetic wave, freeing an opening in the second passivation layer 131b to allow a contact to be made on the first semiconductor layer 131a, selective deposition of a metal contact pad 162 in contact with the first semiconductor layer 131a on the opening in the second passivation layer 112 which has been freed, deposition of a metal bead 163, such as a bead of indium, on the surface of the metal contact pad 16 to enable a connection by hybridization to a reading circuit, as is illustrated in FIG. 5F.

This latter step of formation of the second resonant optical cavity 120 may be carried out using a photosensitive resin from the following sub-steps:

deposition of a layer of photosensitive resin on the surface of the passivation layer 131b, for example by centrifugation, insolation of part of the layer of photosensitive resin, this part being the part intended to form the second resonant optical cavity 120, if the photosensitive resin is of the positive resin type, or the remainder of the layer of photosensitive resin, if said photosensitive resin is of the negative resin type, revelation of the second resonant optical cavity 120 by the use of a solvent.

It may be noted, obviously, that the second resonant optical cavity 120 may also be formed by methods conventionally used in microelectronics. According to this possibility, the step of formation of the second resonant optical cavity may comprise the following sub-steps:

deposition of a layer of the dielectric material which is intended for the formation of the second resonant optical cavity 120 on the surface of the passivation layer 131b, deposition of a layer of photosensitive resin, selective insolation, so as to provide protection of the part of the layer of dielectric material which is intended to form the second resonant optical cavity 120, revelation so as to free of layer of photosensitive resin the part of the layer of dielectric material which is not intended to form the second resonant optical cavity 120, selective attack of the layer of dielectric material, the part of this layer of dielectric material being protected by the photosensitive resin, so as to form the second resonant optical cavity 120.

Figure 6:
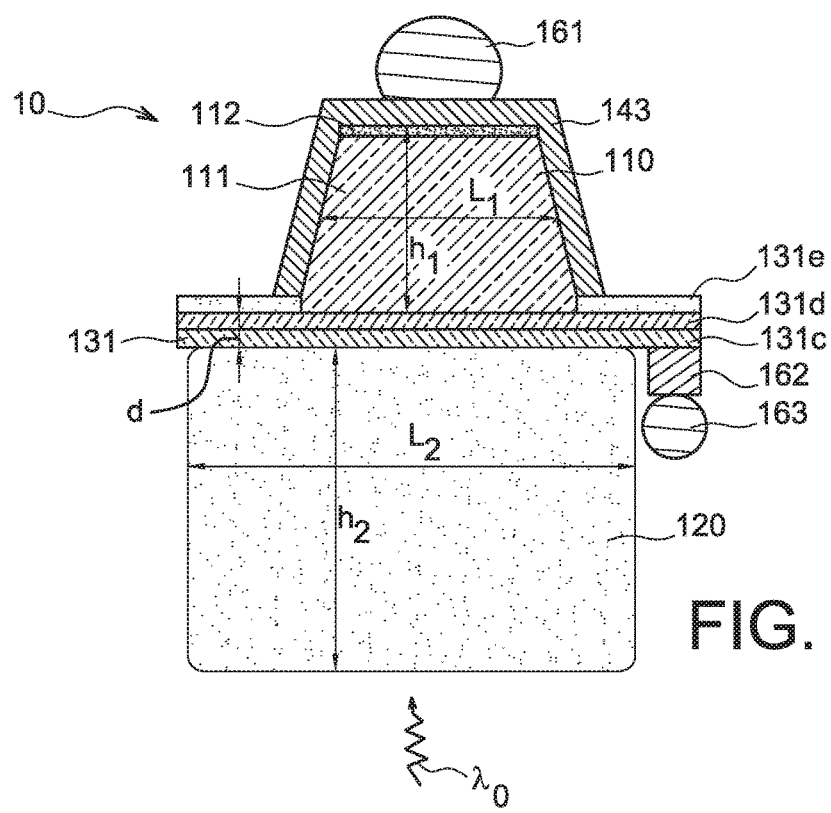
FIG. 6 illustrates a semiconductor structure according to the invention in which the second resonant optical cavity comprises one of the two doped zones separated by a potential barrier of a structure of the barrier photodiode type.

FIG. 6 illustrates a semiconductor structure according to the third layout possibility in which the structure is of the barrier photodetector type. Such a semiconductor structure 10 differs from that obtained with the method of manufacture illustrated by FIGS. 5A to 5F in that the support 131 comprises a first and a third semiconductor layer 131c, 131d. The first semiconductor layer 131c, opposite to the first resonant optical cavity, forms one of the doped zones of the barrier photodetector type whereas the third semiconductor layer 131d forms the barrier layer of this same photodetector. Thus, the first resonant optical cavity 110 comprising the other doped zone of the photodetector, the first semiconductor layer 131c and the first resonant optical cavity 110 are all of a first type of conductivity.

As a reminder, a semiconductor structure of barrier type comprises a first and a second zone of the same type of conductivity separated by a barrier zone. The first zone and the second zone, having a same type of conductivity, comprise identical majority carriers which are by definition the majority carriers of the structure. The barrier zone comprises a band-gap suited to form a barrier to the majority carriers and to allow to pass the minority carriers. To do so, the barrier zone has a band-gap energy greater than those of the first and the second zone with a difference in energy, between the different zones, the smallest possible for the energy band corresponding to the minority carriers, that is to say, the valence band for minority carriers which are holes, and the conduction band for minority carriers which are electrons. Thus, the barrier zone creates, by the difference in band-gap energy with the first and the second zone, a strong potential barrier for the majority carriers. This is small, or even cancelled, for minority carriers, on account of the small difference in energy for the energy band corresponding to the minority carriers.

In this way, when the first zone is reverse polarized, with respect to the second zone, and that an electron-hole pair is generated by a photon in the first zone, the minority carrier generated passes from the first zone to the second zone, and is accelerated by the polarization. The minority carrier is thus collected at the latter.

Within the scope of the semiconductor structure according to the invention illustrated in FIG. 6, the first resonant optical cavity 110 comprises the first zone of which the material is chosen to enable the absorption of the electromagnetic wave, particularly with a suitable band-gap energy. The second zone and the barrier zone are, for their part, arranged in the support 131 and both preferentially have band-gap energies such that they are substantially transparent in the predetermined range of wavelengths. According to this possibility, the first zone and the barrier zone have bigger band-gaps energy than that of the first barrier zone and of which the energy is greater than the energy corresponding to the lower limit of the predetermined range of wavelengths.

In a practical application of such a semiconductor structure 10 for the detection of an electromagnetic wave in the range of wavelengths extending from 3.7 to 4.8 μm, the semiconductor structure may have the following dimensioning:

$L_1$=900 nm, h1=900 nm, d=300 nm with the first and the third semiconductor layer 131c, 131d which have respectively a thickness of 100 and 200 nm, $L_2$=3.5 μm and $h_2$=4 μm.

According to this practical application with a second resonant optical cavity 120 made of a glass of optical index $N_2$=1.4 and a first semiconductor layer 131c and first resonant optical cavity 110 both made of a mercury-cadmium telluride of the type $Cd_{1-x}Hg_xTe$ N doped with x comprised between 0 and 1, it is possible to reach a quantum efficiency of the order of 35%.

A method of manufacturing such a semiconductor structure 10 differs from the method of manufacture illustrated in FIGS. 5A to 5F, in that:

during the step of supplying the substrate 150, the substrate 150 comprises a first and a third semiconductor layer 131c, 131d, the first semiconductor layer 131c being of a first type of conductivity and the third semiconductor layer 131d being intended to form a barrier layer, during the step of deposition of the second semiconductor layer, the second semiconductor layer is of the same type of conductivity as the first semiconductor layer 131d, no step of passivation of the surface of the first semiconductor layer 131c is implemented.

Figure 7:
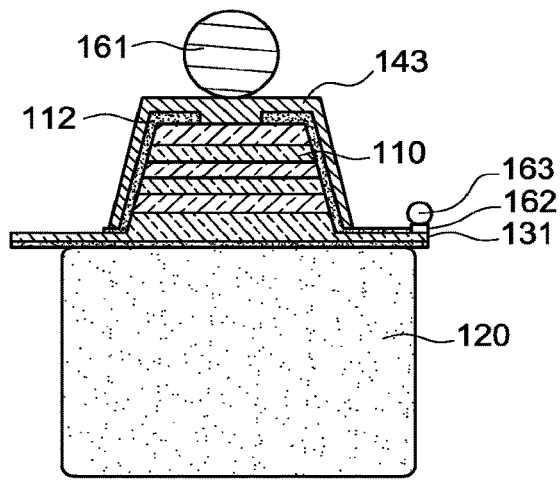
FIG. 7 illustrates a semiconductor structure according to the invention in which the second resonant optical cavity comprises the absorbent part of a structure of the quantum well photodetector type.

FIG. 7 illustrates a semiconductor structure 10 according to the third layout possibility of the invention in which the semiconductor structure 10 is of the quantum well photo-diode type. Such a semiconductor structure 10 differs from the structure illustrated in FIGS. 5A to 5F in that the first resonant optical cavity comprises a plurality of sub-layers forming, on the one hand, an intrinsic zone comprising a plurality of quantum wells, and, on the other hand, a doped semiconductor zone, and in that the first resonant optical cavity 110 is polarized at its part which is opposite to the second resonant optical cavity 120.

Thus such a semiconductor structure 10, unlike that illustrated in FIG. 5F, comprises the first passivation layer 112 on the sides of the first resonant optical cavity 110 and at least one opening in said passivation layer 112 at the part of the first resonant optical cavity 110 opposite to the second resonant optical cavity 120 so as to enable a metal contact between said part and the reflective metal material 143.

The method of manufacturing such a semiconductor structure differs from the method of manufacture illustrated in FIGS. 5A to 5F in that:
  during the step of deposition of the second semiconductor layer 111 the latter is constituted of a plurality of sub-layers forming, on the one hand, an intrinsic zone comprising a plurality of quantum wells and, on the other hand, a doped semiconductor zone,
  the step of passivation of the second semiconductor layer 111 is carried out after etching of the second semiconductor layer 111 so as to passivate the surface of the first semiconductor layer 131a opposite to the substrate, the sides of the first resonant optical cavity 110 and the part of the first resonant optical cavity 110 which is opposite to the second resonant optical cavity 120,
  after the step of passivation, a step of partial etching of the first passivation layer 112 is provided in order to form at least one opening of the first passivation layer 112 at the part of the first resonant optical cavity 110 which is opposite to the first resonant optical cavity 110,
  the step of deposition of the reflective material is carried out so that the reflective material fills the opening in the first passivation layer 112 and thus to provide a metal contact between the reflective material 143 and the first semiconductor layer 111;
  no step of passivation of the surface of the first semiconductor layer 131a which is opposite to the first resonant optical cavity 110 is carried out.

Figure 8:
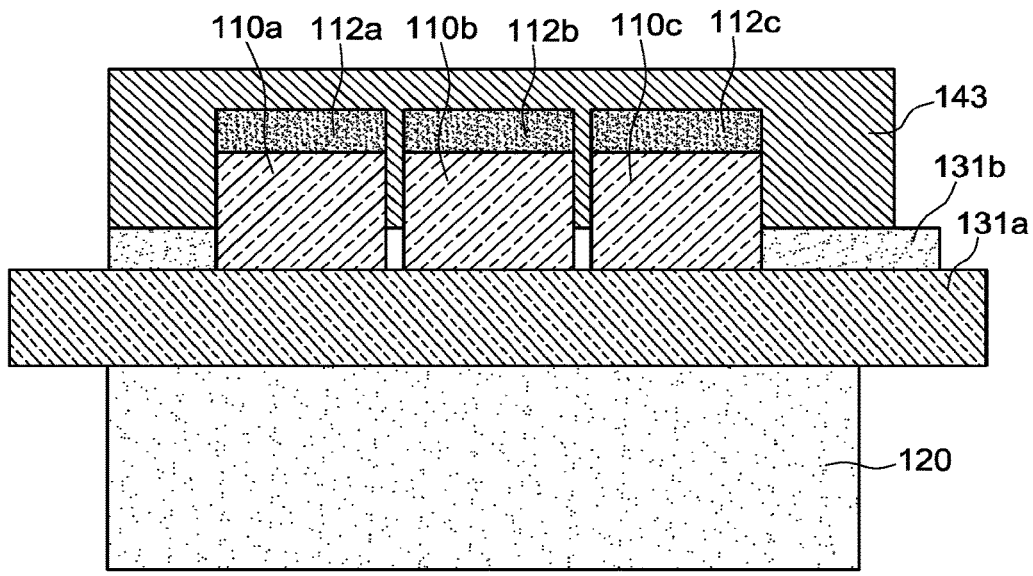
FIG. 8 illustrates a semiconductor structure according to the invention including several first resonant optical cavities.

FIG. 8 schematically illustrates the possibility of a semiconductor structure according to the invention comprising several first resonant optical cavities 110a, 110b, 110c. Thus the semiconductor structure 10 according to FIG. 8, in the section plane illustrated in FIG. 8, comprises three first resonant optical cavities 110a, 110b, 110c, which correspond, for a structure of substantially square shape, to nine first resonant optical cavities.

Such a semiconductor structure 10 differs from a semiconductor structure 10 according to the third layout possibility in that it comprises the plurality of first resonant optical cavities 110a, 110b, 110c, the reflective material 143 covering the first resonant optical cavities 110a, 110b, 110c.

The dimensioning of the first resonant optical cavities 110a, 110b, 110c of such a semiconductor structure 10 respects the same conditions as that of a semiconductor structure 10 according to the third layout possibility of the invention. The first resonant optical cavities are laid out to be each coupled with the second resonant optical cavity 120 and so that the second resonant optical cavity 120 intercepts at least part of the electromagnetic wave.

According to this possibility, the number and the positioning of the first resonant optical cavities 110a, 110b, 110c may be optimized. In fact, it is possible and advantageous to provide the positioning of each of the resonant optical cavities so that it is positioned, with respect to the resonance, at an antinode, that is to say at a resonance peak, of the second resonant optical cavity 120.

The method of manufacturing a semiconductor structure 10 comprising several first resonant optical cavities 110a, 110b, 110c differs from a method of manufacture as illustrated in FIGS. 5A to 5F in that:
  during the step of etching of the second semiconductor layer, the etching is carried out so as to form at least partially the first resonant optical cavities 110a, 110b, 110c with at least one of these dimensions transversal to the emission direction z equal to $L_1$,
  the step of passivation of the surface of the second semiconductor layer 111 is substituted by a step of passivation of the part of the first resonant optical cavity 110 opposite to the second resonant optical cavity 120 and the surface of the first semiconductor layer 131 implemented after the step of etching of the second semiconductor layer 111.

Whatever the layout possibility of the semiconductor structures 10 according to the invention and the configuration of the latter, such structures may equip a semiconductor component 1. FIG. 9 illustrates such a semiconductor component 1, said semiconductor component 1 comprising four semiconductor structures of the same type as that illustrated in FIG. 5F.

In such a component 1, as is illustrated in FIG. 9, the configuration is similar to that described for a semiconductor structure 10 alone, with the sole difference that the support 131 being common, a single contact 162 is necessary to polarize the first semiconductor layer 131a. Thus each of the semiconductor structures 10a, 10b, 10c, 10d, has a bead of indium 161a, 161b, 161c, 161d which is specific to it in contact with the reflective material 143a, 143b, 143c, 143d to enable the polarization of its active zone.

The method of manufacturing such a semiconductor component 1 comprising several semiconductor structures 10a, 10b, 10c, 10d differs from a method of manufacturing a single semiconductor structure in that the steps enabling the manufacture of the first and the second resonant optical cavities are suited so as to enable the manufacture of several first and second resonant optical cavities in a manner similar to the method of manufacturing a semiconductor structure 10 as illustrated in FIG. 8 which enables several first resonant optical cavities 110a, 110b, 110c to be obtained.

The invention claimed is:
1. A semiconductor structure capable of absorbing an electromagnetic wave in a predetermined range of wavelengths which is centered around a wavelength $\lambda_0$, the semiconductor structure comprising:
  at least one first semiconductor resonant optical cavity comprising a first resonance wavelength, the first resonance wavelength being comprised in the predetermined range of wavelengths, the first resonant optical cavity being configured to absorb at least partially the electromagnetic wave and to provide an electrical signal proportional to the absorbed part of the electromagnetic wave,
  wherein the semiconductor structure further comprises:
    a second dielectric resonant optical cavity comprising a second resonance wavelength, the second resonance wavelength being comprised in the predetermined range of wavelengths, the second resonant optical cavity being configured to intercept at least part of the electromagnetic wave and being optically coupled to the first resonant optical cavity, the second resonant optical cavity being transparent to the predetermined range of wavelengths, wherein the second resonant optical cavity comprises an optical index $N_2$ less than 2.

2. The semiconductor structure according to claim 1, wherein the second resonant optical cavity is made of a material selected from the group comprising glasses, thermoplastic polymers, elastomers, thermosetting polymers, photosensitive resins and mixtures of two or more of said materials.

3. The semiconductor structure according to claim 1, wherein the semiconductor structure is configured to receive the electromagnetic wave along a mean emission direction z, the first resonant optical cavity being dimensioned to have at least one first resonance direction, corresponding to the first resonance wavelength, the first resonance direction being transversal to the emission direction z.

4. The semiconductor structure according to claim 3, wherein the first resonant optical cavity has a first width $L_1$ along the first resonance direction, and wherein the second resonant optical cavity has along at least the first resonance direction a second width $L_2$ respecting the following equation:

$$L_2 = L_1 \times M \times \frac{N_2}{N_1},$$

with $L_2$ the second width, $L_1$ the first width, M an odd integer greater than or equal to 1, $N_1$ and $N_2$ the respective optical indices of the first and the second resonant optical cavities.

5. The semiconductor structure according to claim 1, including a support having a first and a second face opposite to each other, the first resonant optical cavity being arranged in contact on the first face and the second resonant optical cavity being arranged in contact on the second face, the support being dimensioned in order to assure optical coupling between the first and the second resonant optical cavities.

6. The semiconductor structure according to claim 1, wherein the semiconductor structure is a structure of the type selected from the group comprising PIN type photodiodes, quantum well photodiodes, barrier type photodetectors, and wherein an active zone of the semiconductor structure is furnished in the first resonant optical cavity.

7. The semiconductor structure according to claim 1, including at least two first resonant optical cavities, the first resonant optical cavities each being optically coupled to the second resonant optical cavity.

8. A semiconductor component comprising a plurality of semiconductor structures each to receive an electromagnetic wave, wherein at least one, of the semiconductor structures is a semiconductor structure according to claim 1.

9. A method of manufacturing a semiconductor structure capable of absorbing an electromagnetic wave in a predetermined range of wavelengths which is centered around a wavelength $\lambda_0$, the method comprising the following steps:

supplying at least one first semiconductor resonant optical cavity comprising a first resonance wavelength, the first resonance wavelength being comprised in the predetermined range of wavelengths, the first resonant optical cavity being configured to absorb at least partially the electromagnetic wave and to provide an electrical signal proportional to the absorbed part of the electromagnetic wave, supplying a second dielectric resonant optical cavity comprising a second resonance wavelength, the second resonant wavelength being comprised in the range of wavelengths, the second resonant optical cavity being configured to intercept part of the electromagnetic wave and being optically coupled to the first resonant optical cavity, wherein the second resonant optical cavity is transparent to the predetermined range of wavelengths and wherein the second resonant optical cavity comprises an optical index $N_2$ less than 2.

10. The method of manufacture according to claim 9 wherein the step of supplying the first resonant optical cavity comprises the following sub-steps:

supplying a semiconductor support comprising a first and a second face, formation of the first resonant optical cavity in contact with the first face of the support, and wherein the step of supplying a second resonant optical cavity consists in forming said second resonant optical cavity in contact with the second face of the support.

11. The method of manufacture according to claim 10, wherein the step of supplying the second resonant optical cavity comprises the following sub-steps:

deposition of a photosensitive resin layer on the surface of the support, exposing a part of the photosensitive resin layer, the part of the photosensitive resin layer corresponding to:

the second resonant optical cavity, if the photosensitive resin layer is made of a positive photosensitive resin type, the photosensitive resin layer excluding the part corresponding to second resonant optical cavity, if said photosensitive resin layer is made of a negative photosensitive resin type, and developing the layer of photosensitive resin using a solvent to form the second optical cavity into the layer of photosensitive resin.

* * * * *